United States Patent
Dale et al.

(10) Patent No.: US 8,704,541 B2
(45) Date of Patent: Apr. 22, 2014

(54) TEST METHOD OF DRIVING APPARATUS AND CIRCUIT TESTING INTERFACE THEREOF

(75) Inventors: Bret Dale, Jericho, VT (US); Oliver Kiehl, Charlotte, VT (US)

(73) Assignee: Nanya Technology Corporation, Taoyuan (TW)

( * ) Notice: Subject to any disclaimer, the term of this patent is extended or adjusted under 35 U.S.C. 154(b) by 209 days.

(21) Appl. No.: 13/308,569

(22) Filed: Dec. 1, 2011

(65) Prior Publication Data

US 2013/0141124 A1 Jun. 6, 2013

(51) Int. Cl.
*G01R 31/00* (2006.01)

(52) U.S. Cl.
USPC .................. 324/750.01; 324/750.3; 324/500

(58) Field of Classification Search
USPC ............... 324/500, 750.3, 762.01–762.03, 324/762.09; 438/14–18
See application file for complete search history.

(56) References Cited

U.S. PATENT DOCUMENTS

| | | | | |
|---|---|---|---|---|
| 5,266,894 A | * | 11/1993 | Takagi et al. | 324/762.01 |
| 5,371,457 A | * | 12/1994 | Lipp | 324/762.02 |
| 7,446,553 B2 | * | 11/2008 | Cano et al. | 324/762.01 |
| 8,368,422 B1 | * | 2/2013 | Dale et al. | 326/16 |
| 2010/0271046 A1 | * | 10/2010 | Bartley et al. | 324/555 |
| 2012/0274348 A1 | * | 11/2012 | Shin et al. | 324/762.01 |

* cited by examiner

*Primary Examiner* — Arleen M Vazquez
*Assistant Examiner* — Robert P Alejnikov, Jr.
(74) *Attorney, Agent, or Firm* — Jianq Chyun IP Office

(57) ABSTRACT

A circuit testing interface and test method are disclosed. The circuit testing interface may include a test current transmitting pad, a test voltage measuring pad, and at least one driving circuit comprising an output terminal. The output terminal of the at least one driving circuit may be coupled to a through-silicon via (TSV). The circuit testing interface may further include at least one switch module, coupled to (1) the output terminal of the driving circuit, (2) the test current transmitting pad, and (3) the test voltage measuring pad.

12 Claims, 4 Drawing Sheets

US 8,704,541 B2

TEST METHOD OF DRIVING APPARATUS AND CIRCUIT TESTING INTERFACE THEREOF

BACKGROUND

1. Field of the Invention

The present application generally relates to a circuit testing interface and test method, and more particularly, to a testing interface of an off-chip driver (OCD) and test method.

2. Description of Related Art

FIG. 1 shows a circuit diagram of a conventional off-chip driver (OCD) and an input buffer. Referring to FIG. 1, the output terminal of the OCD 110 is coupled to a through-silicon via (TSV) 130. An input terminal of the input buffer 120 is coupled to the TSV 130 and the output terminal of the OCD 110.

Traditionally, when the OCD 110 and/or the input buffer 120 are tested, the TSV 130 has to be directly contacted by using a probe on a probe card, and electrical test signals have to be transmitted and received through the TSV 130. In functional mode, the chip OCD 110 is typically attached to other electrical components through the TSV 130. The TSV 130 typically has a relatively low maximum pin capacitance specification. However, since the surface area of a TSV 130 is relatively small, conventional test probes are not configured to reliably probe it. In order to remedy this, one might attach a conventional test pad to the TSV 130 with an on-die metal trace. This attached test probe pad would not typically be used in functional mode because the test probe pad typically has a relatively large parasitic capacitance. This often causes the TSV 130 to have an observed capacitance that is significantly higher than the relatively low maximum pin capacitance specification.

SUMMARY

Accordingly, the present application is directed to a circuit testing interface which can effectively reduce the cost of circuit testing.

The present application is directed to a test method of a circuit which can effectively reduce the cost for testing the circuit.

In one embodiment, a circuit testing interface comprises a test current transmitting pad, a test voltage measuring pad, at least one driving circuit comprising an output terminal. The output terminal of the at least one driving circuit is coupled to a through-silicon via (TSV). The circuit testing interface further comprises at least one switch module, coupled to (1) the output terminal of the driving circuit, (2) the test current transmitting pad, and (3) the test voltage measuring pad.

In another embodiment, a test method of a driving apparatus is disclosed. The driving apparatus comprises at least one driving circuit, the driving apparatus having an output terminal, and the output terminal of the driving circuit coupled to a TSV. The test method comprises creating an electrical connection between a test current transmitting pad and a test voltage measuring pad on the one hand, and the at least one driving circuit on the other hand via at least one switch module. The test method further comprises turning on, via the switch module, a connection path between the driving circuit and the test current transmitting pad, and receiving a test current from the test current transmitting pad. The test method further comprises measuring a test output voltage generated by the driving circuit in response to the test current.

As described above, in some embodiments, a test current transmitting pad and a test voltage measuring pad are connected to a TSV through a switch module, and a test current is input or sunk from the driving circuit through the test current transmitting pad. Besides, in test mode, an interface for measuring a test voltage generated by the driving circuit according to the test current is provided through the test voltage measuring pad, so that the driving circuit can be tested without directly contacting the TSV. Thereby, the driving circuit can be tested on a general test machine and accordingly cost for testing the driving circuit can be reduced. Furthermore, in functional mode, the connection between the TSV and the driving circuit is cut off, and the driving circuit can be operated normally.

In the following detailed description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that various changes may be made without departing from the spirit and scope of the present invention. The following detailed description is, therefore, not to be taken in a limiting sense.

DETAILED DESCRIPTION

Figure 1:
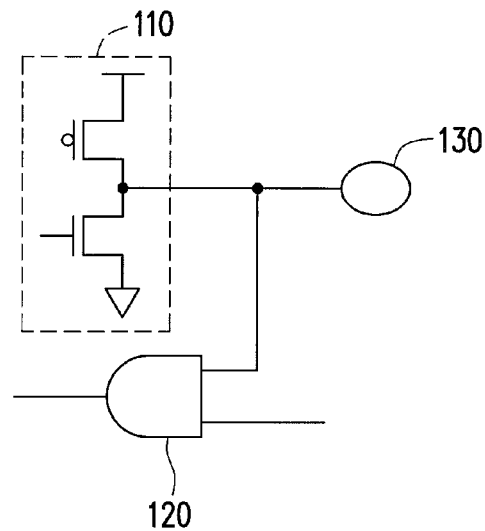
FIG. 1 is a circuit diagram of a conventional off-chip driver (OCD) and an input buffer.

Reference will now be made in detail to the present preferred embodiments of the invention, examples of which are illustrated in the accompanying drawings. Wherever possible, the same reference numbers are used in the drawings and the description to refer to the same or like parts.

Figure 2:
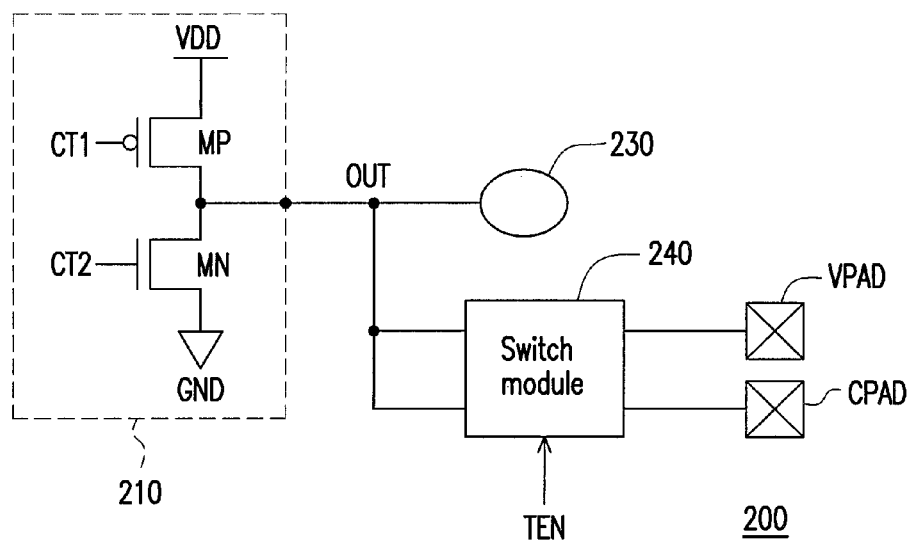
FIG. 2 is a diagram of a circuit testing interface 200 according to an embodiment of the present application.

FIG. 2 is a diagram of a circuit testing interface 200 according to an embodiment of the application. Referring to FIG. 2, the circuit testing interface 200 includes a test current transmitting pad CPAD, a test voltage measuring pad VPAD, a driving circuit 210, and a switch module 240. The output terminal OUT of the driving circuit 210 is coupled to a through-silicon via (TSV) 230, and the switch module 240 is coupled to the output terminal OUT of the driving circuit 210, the test current transmitting pad CPAD, and the test voltage measuring pad VPAD. The switch module 240 is configured to receive a test enabling signal TEN and turn on or off a connection path between the test current transmitting pad CPAD and the driving circuit 210. The switch module 240 is also configured to turn on or off a connection path between the test voltage measuring pad VPAD and the driving circuit 210 based on the transmission of the test enabling signal TEN. The driving circuit 210 may be, for example, an off-chip driver (OCD).

In operation, when the driving circuit 210 is tested, the switch module 240 is configured to turn on the connection path between the test current transmitting pad CPAD and also the driving circuit 210 and the connection path between the test voltage measuring pad VPAD and the driving circuit 210. A test current may be transmitted to the driving circuit 210 through the test current transmitting pad CPAD, and a test output voltage on the output terminal OUT of the driving circuit 210 may be measured through the test voltage measuring pad VPAD in order to test the driving circuit 210.

In an embodiment, when the driving circuit 210 is tested, a test current may be input to the test current transmitting pad CPAD from a test machine, and the test current may be passed through the driving circuit 210. In an embodiment, as the test current runs through the driving circuit 210, the test machine may measure the test output voltage generated by the output terminal OUT of the driving circuit 210 through the test voltage measuring pad VPAD. Thus, in this embodiment, the test machine can obtain the output impedance of the driving circuit 210 according to the values of the test output voltage and the test current.

According to another embodiment, the driving circuit 210 may include a P-type transistor MP and an N-type transistor MN. The P-type transistor MP has a control terminal (gate), a first terminal (source), and a second terminal (drain). The gate of the P-type transistor MP may be configured to receive a control signal CT1, the source of MP can be coupled to a reference voltage VDD, and the drain of MP can be coupled to the output terminal OUT of the driving circuit 210. The N-type transistor MN may have a control terminal (gate), a first terminal (source), and a second terminal (drain). The gate of the N-type transistor MN may be configured to receive a control signal CT2, the source of MP can be coupled to the output terminal OUT of the driving circuit 210, and the drain of MP can be coupled to ground GND.

In operation, testing the driving circuit 210 includes, among other things, testing the current sourcing and sinking capabilities of the P-type transistor MP and the N-type transistor MN. According to some embodiments, when the current sourcing capability of the P-type transistor MP is to be tested, the test machine can issue a control command to turn on the P-type transistor MP through the control signal CT1 and turn off the N-type transistor MN through the control signal CT2. The switch module 240 can turn on the connection path between the test current transmitting pad CPAD and the driving circuit 210 and the connection path between the test voltage measuring pad VPAD and the driving circuit 210. In some embodiments, the switch module 240 can be activated and/or controlled by TEN. The test machine can sink the test current through the test current transmitting pad CPAD. In an embodiment, the test current can run from the reference voltage VDD to the test current transmitting pad CPAD via the P-type transistor MP, the output terminal OUT of the driving circuit 210, and the switch module 240. In many embodiments, the value of the test output voltage VTEST at the output terminal OUT of the driving circuit 210 may be approximately equal to the reference voltage VDD minus the product of the test current I and the on-state resistance RONP of the P-type transistor MP (i.e., VTEST=VDD−I×RONP).

In operation, when the current sinking capability of the N-type transistor MN is tested, the test machine may issue a control command to turn off the P-type transistor MP, the control command being transmitted through the control signal CT1, and turn on the N-type transistor MN, the control command being transmitted through the control signal CT2. In an embodiment, the switch module 240 can turn on the connection path between the test current transmitting pad CPAD and the driving circuit 210 and the connection path between the test voltage measuring pad VPAD and the driving circuit 210. In some embodiments, the test machine can input the test current through the test current transmitting pad CPAD. As shown in FIG. 2, the test current can run from the test current transmitting pad CPAD to the N-type transistor MN and the ground GND via the switch module 240 and the output terminal OUT of the driving circuit 210. The test output voltage VTEST at the output terminal OUT of the driving circuit 210 may be approximately equal to the ground GND plus the product of the test current I and the on-state resistance RONN of the N-type transistor MN (i.e., VTEST=GND+I×RONN). Generally, the ground GND is equal to 0V.

As discussed above, according to some embodiments, when the driving circuit 210 is tested, one does not need to directly probe the TSV 230 to transmit or measure electrical signals. Thus, parasitic capacitance introduced at the TSV 230 can be avoided.

Figure 3:
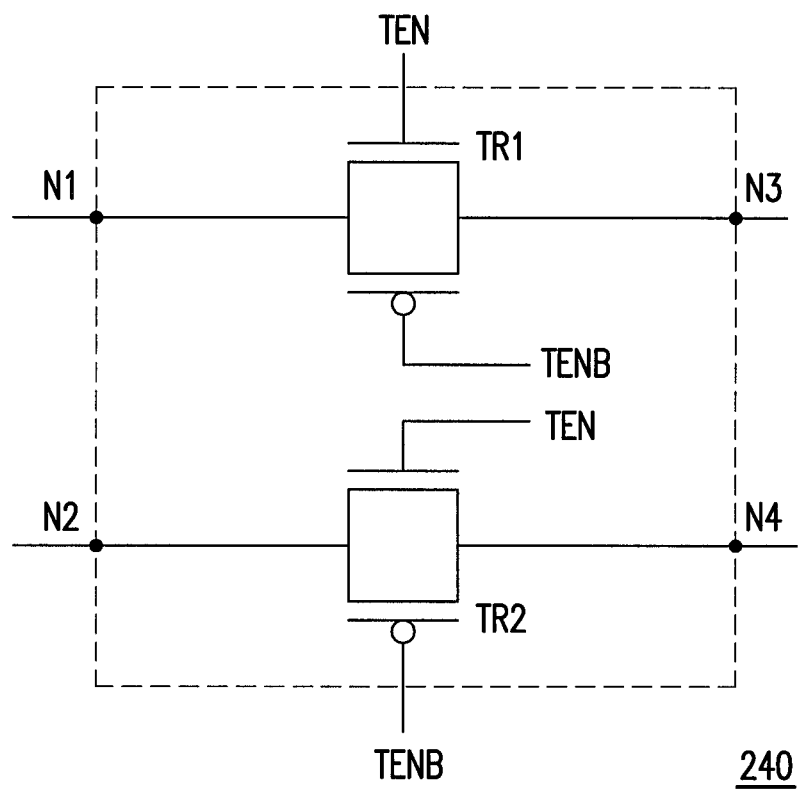
FIG. 3 is a diagram illustrating an implementation of a switch module 240 according to an embodiment of the present application.

FIG. 3 is a diagram illustrating an implementation of the switch module 240 according to an embodiment of the present application. Referring to FIG. 3, the switch module 240 includes switch units composed of logic transmission gates TR1 and TR2. The logic transmission gate TR1 is coupled between nodes N1 and N3, wherein the node N1 is connected to the output terminal of the driving circuit, and the node N3 is connected to the test current transmitting pad. The logic transmission gate TR1 receives test enabling signals TEN and TENB and may be turned on and off by the test enabling signals TEN and TENB. The test enabling signals TEN and TENB may be logic signals having reversed phases. The logic transmission gate TR2 is coupled between nodes N2 and N4, wherein the node N2 is connected to the output terminal of the driving circuit, and the node N4 is connected to the test voltage measuring pad. The logic transmission gate TR2 also receives the test enabling signals TEN and TENB and may be turned on and off by the test enabling signals TEN and TENB. It should be noted that the logic transmission gates TR1 and TR2 may have the same on or off state.

Figure 4:
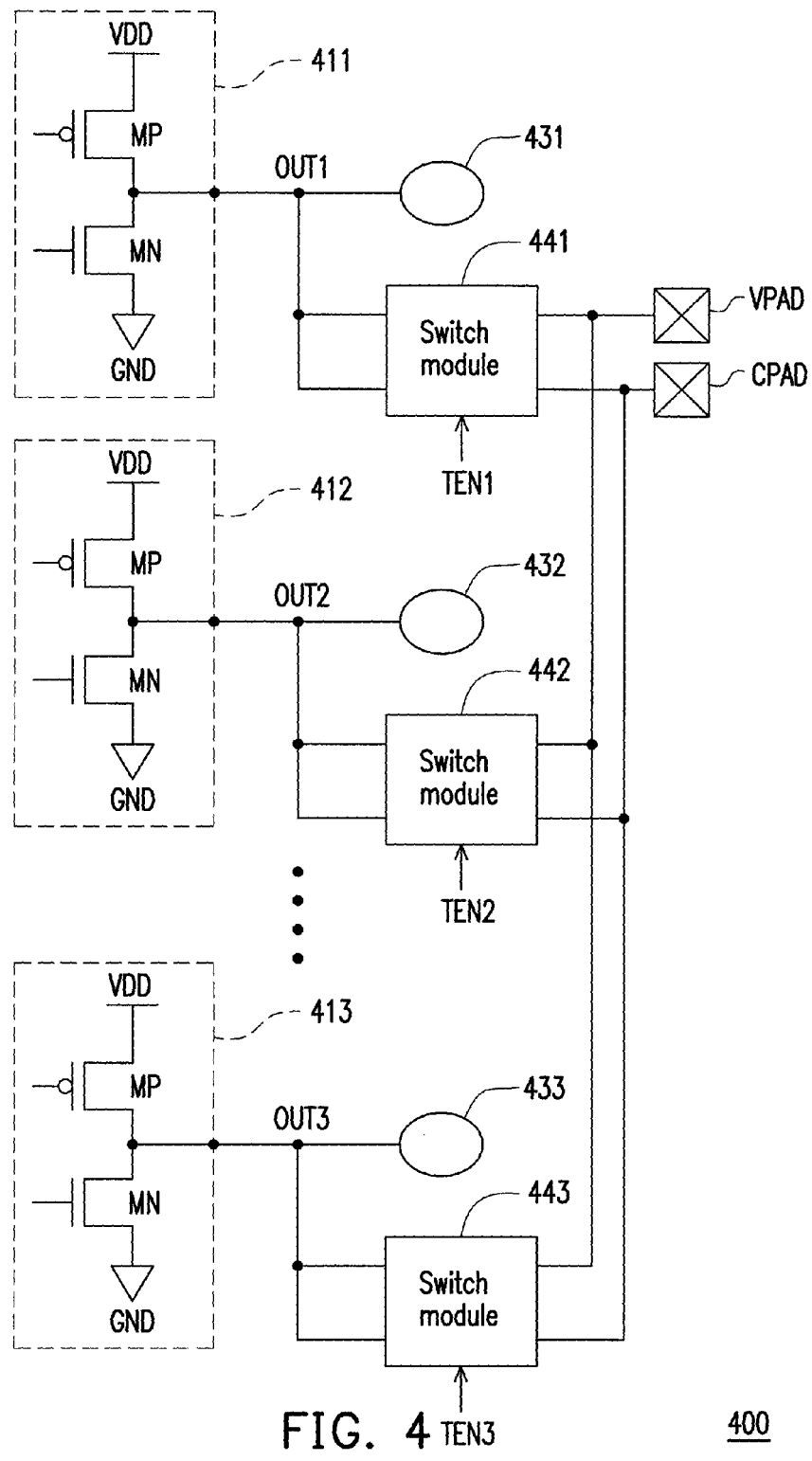
FIG. 4 is a diagram of a circuit testing interface 400 according to another embodiment of the present application.

FIG. 4 is a diagram of a circuit testing interface 400 according to another embodiment of the present application. Referring to FIG. 4, in one embodiment, the circuit testing interface 400 includes a test current transmitting pad CPAD, a test voltage measuring pad VPAD, a plurality of driving circuits 411-413, and a plurality of switch modules 441-443. The output terminals OUT1-OUT3 of the driving circuits 411-413 are coupled to TSVs 431-433, respectively. In some embodiments, when the driving circuits 411-413 are tested, only one of the driving circuits 411-413 can be tested each time. According to this embodiment, one of the driving circuits 411-413 (for example, the driving circuit 411) may be tested by turning on the corresponding switch modules 441-443 (for example, the switch module 441).

In operation, if, for example, the driving circuit 411 is tested first, the connection path between the driving circuit 411 and the test current transmitting pad CPAD and the test voltage measuring pad VPAD can be turned on by using the test enabling signal TEN1 to enable the switch module 441. In this embodiment, the connection paths between the driving circuits 412-413 and the test current transmitting pad CPAD and the test voltage measuring pad VPAD may be turned off via test enabling signals TEN2-TEN3. Accordingly, the test current input or sunk by the test machine through the test current transmitting pad CPAD can completely run through the driving circuit 411, and the test output voltage generated on the output terminal OUT1 of the driving circuit 411 can be transmitted to the test voltage measuring pad VPAD.

In one embodiment, after testing of the driving circuit 411 is completed, the connection paths between the driving circuits 411 and 413 and the test current transmitting pad CPAD and the test voltage measuring pad VPAD may be turned off via the test enabling signals TEN1 and TEN3 by using the switch modules 441 and 443. Additionally, the connection path between the driving circuit 412 and the test current transmitting pad CPAD and the test voltage measuring pad VPAD may be turned on via the test enabling signal TEN2 by using the switch module 442, so as to test the driving circuit 412. Similarly, after testing of the driving circuit 412 is completed, all the other driving circuits on the chip can be tested one by one through the mechanisms described above.

Figure 5:
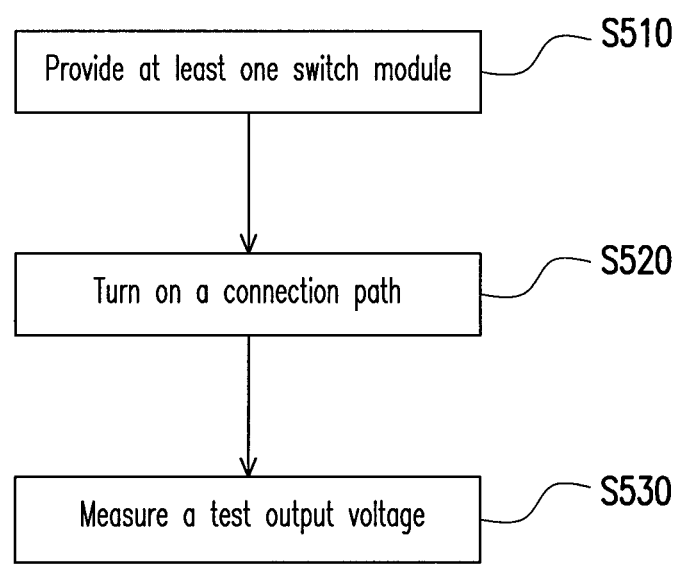
FIG. 5 is a flowchart illustrating a test method of a driving apparatus according to an embodiment of the present application.

FIG. 5 is a flowchart illustrating a test method 500 of a driving apparatus according to an embodiment of the present application. According to many embodiments, the driving apparatus includes at least one driving circuit having an output terminal of the driving circuit being coupled to a TSV. According to a first method step S510, at least one switch module is provided, wherein the switch module is serially connected between the driving circuit and a test current transmitting pad and a test voltage measuring pad. In a next method step S520, a connection path between the driving circuit and the test current transmitting pad is turned by using the switch module, and a test current is input or sunk via the test current transmitting pad. In a last method step S530, a test output voltage generated by the driving circuit, and related to the test current, is measured by using the test voltage measuring pad.

In summary, the present application recites a test current transmitting pad and a test voltage measuring pad for providing a test voltage. In some embodiments, when a test operation is activated, a switch module may be turned on to transmit electrical test signals (a test current and a test output voltage) between a driving circuit being tested, on one hand, and the test current transmitting pad and the test voltage measuring pad, on the other hand, so as to test the driving circuit.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims and equivalents thereof.

What is claimed is:

1. A circuit testing interface, comprising:
a test current transmitting pad;
a test voltage measuring pad;
at least one driving circuit comprising an output terminal, the output terminal of the at least one driving circuit being coupled to a through-silicon via (TSV); and
at least one switch module, coupled to (1) the output terminal of the driving circuit, (2) the test current transmitting pad, and (3) the test voltage measuring pad,
wherein the at least one switch module comprises an electrical connection between the test current transmitting pad and the output terminal of the at least one driving circuit.

2. The circuit testing interface of claim 1, wherein the at least one switch module comprises an electrical connection between the test voltage measuring pad and the output terminal of the at least one driving circuit.

3. The circuit testing interface of claim 1, wherein the driving circuit further comprises:
a P-type transistor, having a first terminal, a second terminal, and a control terminal, wherein the first terminal is coupled to a reference voltage, and the control terminal is configured to receive a first control signal; and
an N-type transistor, having a first terminal, a second terminal, and a control terminal, wherein the first terminal is coupled to the second terminal of the P-type transistor and the output terminal of the driving circuit, the second terminal of the N-type transistor is coupled to ground, and the control terminal is configured to receive a second control signal.

4. The circuit testing interface of claim 3, wherein the circuit testing interface is configured such that when the P-type transistor is turned on, the N-type transistor is turned off, and the switch module creates an electrical connection between the test current transmitting pad and the output terminal of the driving circuit and a test current is passed through the P-type transistor and a test output voltage generated on the output terminal of the driving circuit.

5. The circuit testing interface of claim 3, wherein the circuit testing interface is configured such that when the N-type transistor is turned on, the P-type transistor is turned off, and the switch module creates an electrical connection between the test current transmitting pad and the output terminal of the driving circuit, and a test current is received by the N-type transistor and generates a test output voltage on the output terminal of the driving circuit.

6. The circuit testing interface of claim 1, wherein the switch module comprises:
a first switch unit, coupled between the test current transmitting pad and the driving circuit; and
a second switch unit, coupled between the test voltage measuring pad and the driving circuit.

7. The circuit testing interface of claim 6, wherein the first switch unit and the second switch unit are configured to switch on or off.

8. The circuit testing interface of claim 6, wherein the first switch unit and the second switch unit are logic transmission gates.

9. The circuit testing interface of claim 1, wherein the TSV and the test current transmitting pad and the test voltage measuring pad each have a parasitic capacitance, and the parasitic capacitance of the TSV is smaller than the parasitic capacitances of each of the test current transmitting pad and the test voltage measuring pad.

10. A test method of a driving apparatus, wherein the driving apparatus comprises at least one driving circuit, the driving apparatus having an output terminal, and the output terminal of the driving circuit coupled to a TSV, the test method comprising:
creating an electrical connection between a test current transmitting pad and a test voltage measuring pad on the one hand, and the at least one driving circuit on the other hand via at least one switch module;
turning on, via the switch module, a connection path between the driving circuit and the test current transmitting pad, and receiving a test current from the test current transmitting pad; and
measuring a test output voltage generated by the driving circuit in response to the test current.

11. The test method of claim 10, wherein receiving the test current from the test current transmitting pad comprises:
turning on a P-type transistor in the driving circuit, and turning off a N-type transistor in the driving circuit; and
driving the test current through the P-type transistor.

12. The test method of claim 10, wherein receiving the test current from the test current transmitting pad comprises:
turning on a N-type transistor in the driving circuit, and turning off a P-type transistor in the driving circuit; and
driving the test current through the N-type transistor.

* * * * *